United States Patent [19]

Rougeot

[11] Patent Number: 4,799,094
[45] Date of Patent: Jan. 17, 1989

[54] LARGE-FORMAT PHOTOSENSITIVE DEVICE AND A METHOD OF UTILIZATION

[75] Inventor: Henri Rougeot, St. Nazaire Les Eymes, France

[73] Assignee: Thomson-CSF, Paris, France

[21] Appl. No.: 809,508

[22] Filed: Dec. 16, 1985

[30] Foreign Application Priority Data

Dec. 27, 1984 [FR] France .................. 84 19919

[51] Int. Cl.⁴ ............................... H01L 27/14
[52] U.S. Cl. ................................. 357/30; 357/31; 357/32; 357/15; 357/2
[58] Field of Search .............. 357/30 K, 30 Q, 30 R, 357/30 H, 30 D, 30 G, 30 C, 30 B, 15, 15 LA, 2, 59 C, 59 D, 59 B, 32, 24 LR, 31

[56] References Cited

U.S. PATENT DOCUMENTS

| | | | |
|---|---|---|---|
| 3,488,508 | 1/1970 | Weimer | 307/311 X |
| 3,935,446 | 1/1976 | Michon | 357/32 X |
| 4,146,904 | 3/1979 | Baertsch et al. | 357/30 |
| 4,327,291 | 4/1982 | Chapman et al. | 357/30 D X |
| 4,520,380 | 5/1985 | Ovshinsky et al. | 357/30 K X |
| 4,583,108 | 4/1986 | Sirieix | 357/30 D |
| 4,630,090 | 12/1986 | Simmons et al. | 357/24 LR |

FOREIGN PATENT DOCUMENTS

| | | |
|---|---|---|
| 0028960 | 5/1981 | European Pat. Off. . |
| 0060752 | 9/1982 | European Pat. Off. . |
| 1258572 | 12/1971 | United Kingdom . |

*Primary Examiner*—Andrew J. James
*Assistant Examiner*—William Mintel
*Attorney, Agent, or Firm*—Roland Plottel

[57] ABSTRACT

A large-format photosensitive device for detection of radiographic images comprises a semiconductor substrate of lightly n-doped hydrogenated amorphous silicon. On one face of the substrate are supported rectangular picture frame-like pads disposed in a matrix array, each having a central opening and formed of material which provides a rectifying junction with the semiconductor substrate, a layer of insulating material, and a control grid capacitively coupled to the pads. On the other face of the substrate are supported an array of drain electrodes located opposite the central openings of the pads, ladder-type source electrodes which circumscribe the drains, a layer of insulating material, and a conductive pattern for interconnecting all of the drains in a common row of all the columns in the array.

15 Claims, 2 Drawing Sheets

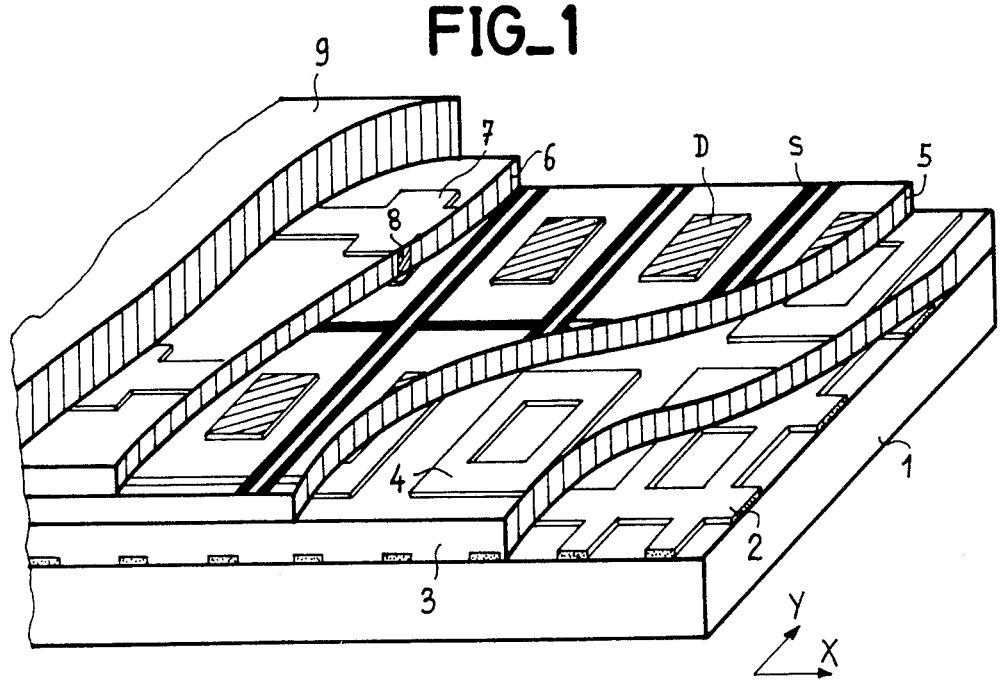
FIG_1
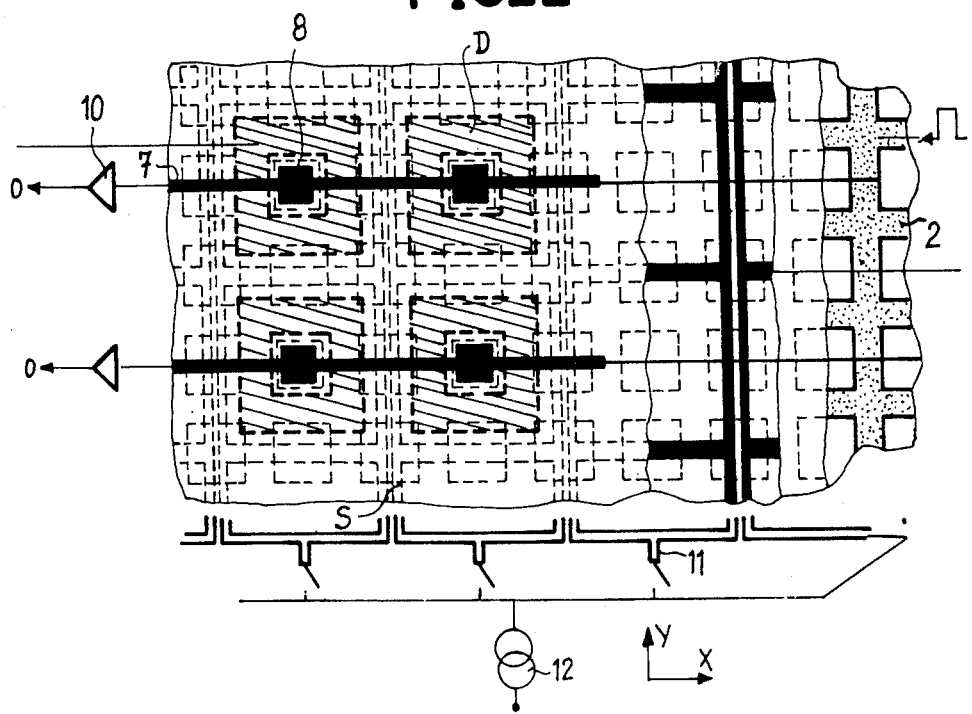
FIG_2

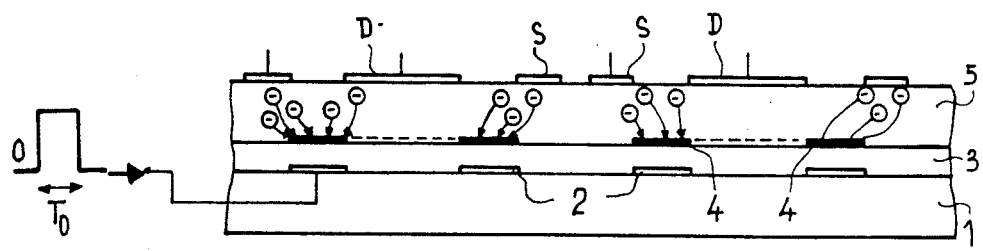
FIG_3
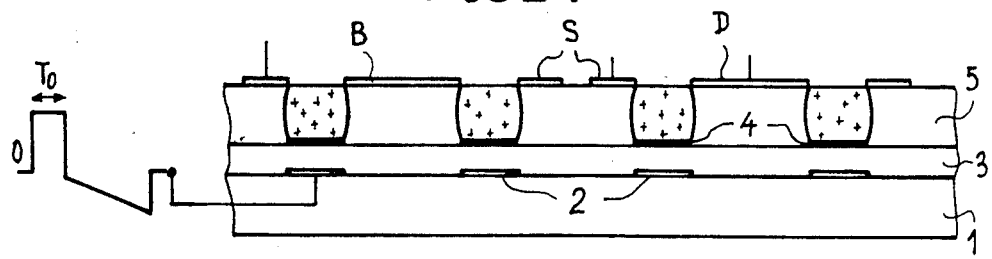
FIG_4
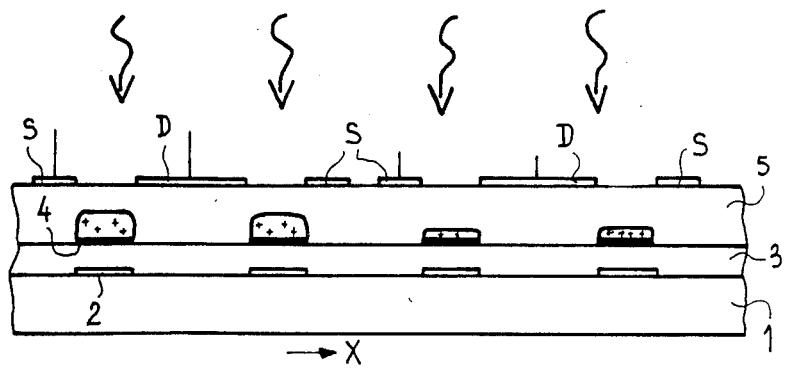
FIG_5
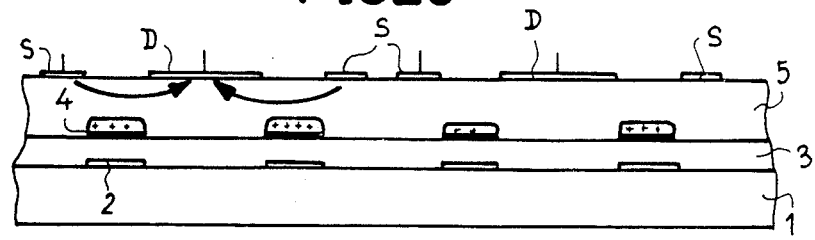
FIG_6

LARGE-FORMAT PHOTOSENSITIVE DEVICE AND A METHOD OF UTILIZATION

BACKGROUND OF THE INVENTION

1. Field of the Invention

The present invention relates to a large-format photosensitive device and is also directed to a method for the utilization of such a device.

The large-format photosensitive device in accordance with the invention is more particularly applicable to the detection of radiological images but can also be employed for detecting other types of radiation such as visible radiation, for example.

In the field of detection of radiological images, current research is concerned with the need to replace radiological films with a view to obtaining radiological information in the form of an electric signal. A significant advantage of this method lies in the feasibility of image processing.

2. Description of the Prior Art

Among the filmless radiographic techniques developed in the prior art, one example which deserves mention is the use of flat panels that are exposed to x-radiation and read-out by laser radiation. Another noteworthy example is the use of linear detector arrays which pass in front of the x-ray emitting substance.

SUMMARY OF THE INVENTION

The present invention relates to an original structure of a large-format photosensitive device.

The large-format photosensitive device in accordance with the invention offers in particular the following advantages:

the possibility of obtaining a radiological format of $36 \times 43$ cm$^2$, for example;

a small bulk equal to that of a radiological film cassette;

possible adaptation to existing radiographic equipment;

higher electrooptical performances than those of a radiographic film;

performances which are compatible with medical radiography, for example in regard to saturation dose, dynamic range, resolving power, write time, image reconstruction time, image processing, and so on;

high sensitivity;

high-speed generation of electric signals for image processing.

The large-format photosensitive device, in accordace with the present invention essentially comprises a semiconductor substrate of lightly n-doped hydrogenated amorphous silicon, having a first face and a second face.

The first face of the semiconductor substrate supports the following superposed elements:

frame-shaped pad of substantially rectangular shape with a central opening, which are uniformly spaced in rows and columns, said pads being formed of material that forms a rectifying a junction with the semiconductor substrate and serving as a floating grid, a layer of insulating material, and a conductive pattern disposed opposite contours of the floating grid and serving as a control grid The second face of said semiconductor substrate supports the following superposed elements:

conductive element designated as drains which are located opposite the central openings of the pads of the floating grid and ladder-type electrodes designated as sources which circumscribe the drains, and;

connections between the drains of a common row of the columns.

BRIEF DESCRIPTION OF THE DRAWINGS

Other features of the invention will be more apparent to those skilled in the art upon consideration of the following description and accompanying drawings, wherein:

FIG. 1 is a perspective view of one embodiment of a photosensitive device in accordance with the invention;

FIG. 2 is a top view of the device shown in FIG. 1;

FIGS. 3 to 6 are sectional views which illustrate the reset, write and readout operations of the device in accordance with the invention.

In the different figures, the same references designate the same elements but the dimensions and proportions of the various elements have not been observed for the sake of enhanced clarity.

DESCRIPTION OF THE PREFERRED EMBODIMENT

FIG. 1 is a perspective view of one embodiment of a photosensitive device in accordance with the invention.

A substrate 1 of insulating material such as glass, alumina, quartz, or fused silica, for example, is covered on one face with a grid-like network of conductor 2 designated hereinafter as a control grid. These conductors are deposited in two perpendicular directions designated in FIG. 1 by the references X and Y to form the grid.

The entire surface of the substrate 1 which carries the control grid is coated with a layer 3 of insulating material such as silica or silicon nitride, for example.

There is then deposited on the layer 3 of insulating material an array of picture frame-shaped pads 4 which will hereinafter be designated as floating grids.

The elements of the floating grid shown in FIG. 1 have a rectangular shape with a central aperture or opening which is also rectangular.

Said floating grids are uniformly spaced in a matrix consisting of rows (direction X) and columns (direction Y).

The material used for forming the floating grids forms a rectifying a junction with the semiconductor substrate 5 of lightly n-doped hydrogenated amorphous silicon which covers said grids as will hereinafter become apparent.

In consequence, said floating grids can be made, for example, of p-doped amorphous or polycrystalline silicon. They can also be made of a metal such as platinum, for example, with a view to forming Schottky junctions.

As can readily be understood, it is possible to make use of a floating grid of picture frame-like elements having a shape other than that shown in FIG. 1, for example a square shape with a square or retangular central opening.

Whatever shape may be adopted for the floating grid, there is employed a control grid 2 which is deposited around the contours of the floating grid as can be seen from FIG. 1.

The semiconductor substrate 5 of lightly n-doped hydrogenated amorphous silicon referred-to in the foregoing is deposited on the floating grid.

This type of semiconductor has photoconductive properties. In order to obtain a semiconductor substrate of lightly n-doped hydrogenated amorphous silicon, compensation is achieved by employing a substance such as boron, for example. This compensation makes it possible to reduce the n-type doping of the net hydrogenated amorphous silicon.

It is already known how to manufacture large-format panels of hydrogenated amorphous silicon. By way of example, panels of hydrogenated amorphous silicon having radiographic dimensions corresponding to a format of $36 \times 43$ cm$^2$ may accordingly be obtained.

Two types of electrodes are then provided to the semiconductor substrate 5:

a first type of electrode consists of conductive pads or so-called drains D which are located opposite some the central openings the of the floating grid 4;

a second type of electrode is designed in the form of ladders known as sources S. These sources circumscribe the floating grids and are disposed along the columns of floating grids, that is, in the direction Y as shown in FIG. 1.

A layer 6 of insulating material is then deposited on said electrodes and adapted to carry the connections 7 and 8 which serve to interconnect the drains D located above each line of floating grids in the direction X. The connections 7 and 8 are formed of transparent conductive material such as indium oxide or stannic oxide. Similarly, the insulating material 6 must be transparent. It may be formed of silicon nitride or of silicon oxide.

The drain electrodes D and source electrodes S can be formed by implantation of phosphorus into the semiconductor substrate to increase locally the n-type doping where such phosphorous is implanted to a level higher than that in the bulk of the substrate. This implantation can be performed through the insulating layer 6 if desired.

The drain electrodes D and source electrodes S can also be formed by lithography after processing of the semiconductor substrate 5 with a view to obtaining n-doped amorphous silicon.

When the photosensitive device is employed for detecting radiographic images, a layer 9 of scintillator material is deposited on the layer 6 of insulating material which carries the connections 7 and 8. Said scintillator 9 has the function of converting the x-radiation to visible radiation for which the layer 6 and the connections 7 must be transparent.

The scintillators mentioned above are fabricated in known manner from materials such as, for example, alkali halides, zinc or cadmium sulfide, zinc or cadmium tungstate, rare-earth sulfoxides, or gadolinium sulfoxides with an organic binder, and so on.

It should be observed that the insulating layer 1 is necessary for operation of the device in accordance with the invention and essentially performs a protective and support function.

Similarly, the insulating layer 6 can be dispensed with in the event that the device is employed for detection of radiographic images and requires the use of a scintillator.

In this case, is possible to deposit the connections 7 directly on the layer 9 of scintillator which is insulating and to establish bonds 8 between said connections 7 and the drains D. One advantage of these embodiments lies in the fact that the connections 7 and 8 do not need to be transparent to the radiation transmitted by the scintillator.

FIG. 2 is a top view of the device shown in FIG. 1.

It is observed that each connection 7 between drains D is connected to an output amplifier 10. Each ladder-type source electrode S is connected to a multiplexer which is in turn connected to a current source 12.

The output amplifiers 10 and the multiplexer 12 can be deposited on the insulating substrate 6 on which the remainder of the photosensitive device is also deposited. In order to construct the output amplifiers, it is possible for example to employ JFET transistors formed on polycrystalline silicon.

The operation of the device in accordance with the invention will now be explained with reference to FIGS. 3 to 6 which are sectional views of the basic structure of the device shown in FIG. 1.

In these figures, the insulating layer 6 and the scintillator layer 9 have not been illustrated for reasons of clarity.

The basic structure can be simply described as follows. It involves the n-type semiconductive substrate 5 which includes first and second opposite faces. On one face there is included an array of rows and columns of picture frame-shaped conductive pads 4 that make rectifying connection to the substrate 5 and serve as a floating grid. Capacitively coupled to this floating grid by way of an insulating layer 3 is a control grid formed by a conductive pattern 2.

On the other face of the substrate are formed sources S and drains D. Typically these are regions in the substrate 5 that have been implanted to increase locally the n-type doping of the substrate. The drain regions D are arranged in rows and columns and each drain region lies opposite an apertured region in the array of frame-like pads 4. Also included at this other face are the sources S. The sources S form a rows of ladders, each ladder including a pair of long side members extending in the Y direction and a succession of rungs in the X direction, and between the successive rungs of a ladder are included a row of drains.

FIGS. 3 and 4 illustrate the operation involved in zero-resetting of the panel.

A positive pulse is applied to the control grids 2 and is transmitted to the floating grids 4 by capacitive effect.

The diodes constituted by the floating grids 4 and by the semiconductor substrate 5 are accordingly biased in the forward or conducting direction.

Negative charges are stored on the floating grids 4. After a time interval To has elapsed, the control grids 4 are restored to the ground potential of the device. As illustrated in FIG. 4, the floating grids retain their negative charges and consequently induce positive bound charges in the semiconductor substrate 5. As a consequence, diodes constituted by the floating grids 4 and by the semiconductor substrate 5 are cut-off. Conduction between the peripheral source electrodes 5 and the central drain D is then blocked by complete obstruction of the channels located above the floating grids 4.

FIG. 5 illustrates the writing of information in the photosensitive device in accordance with the invention.

This device receives the exciting light radiation represented schematically by wavy arrows in the figure.

Said exciting radiation can emanate from the scintillator but can also be produced directly by the radiation to be detected.

The light produced increases the depth of the channels located above the floating grids 4. It is recalled that these channels had been totally closed or obstructed at the time of zero-resetting of the device (as shown in FIG. 4).

In FIG. 5, it is shown diagrammatically that the degree of opening of the channels varies according to the quantity of light received by each floating grid 4.

FIG. 6 illustrates the reading of the light information received by the device in accordance with the invention.

One method of reading consists in measuring the current at the output of all the amplifiers whilst the multiplexer 11 successively connects each ladder-type source 5 to the current source 12.

The state of each channel between the peripheral source and the central drain is thus measured successively.

Each channel to be measured is set in a predetermined state which depends on the light intensity which it has received.

The intensity of the current which flows between the source and the drain of a detector measures the total charge neutralized at the time of writing.

Only a small generation of charge carriers within the channel is sufficient to produce a great variation in the current between source and drain.

The charge collected on each drain depends on the readout time T. The gain of the device is therefore adjusted by modifying the readout time T.

A thermal generation of charge carriers tends to open each channel in the absence of any external excitation. In order to avoid the need to take this into account and to correct the collected output signal, a negative ramp-function signal is applied to the control grids after the positive pulse of duration To.

Said negative ramp-function signal is shown in FIG. 4. The effect of this signal is to restore to the floating grids 4 the negative charges lost as a result of thermal generation. Said negative ramp-function signal is preferably given a time-duration such that the negative ramp-function signal has terminated at the time of reading of the detectors.

The characteristics of the device in accordance with the invention have been calculated theoretically. Such characteristics include the saturation dose, the dynamic range, the resolving power, the write time, the image reconstruction time, and so on.

To this end, each detector has been assimilated with four juxtaposed linear field-effect transistors at the periphery of a central drain.

The characteristics of the device in accordance with the invention are compatible with medical radiography.

What is claimed is:

1. A large-format photosensitive device, wherein said device comprises:
   a semiconductor substrate of n-doped hydrogenated amorphous silicon, said substrate having a first face and a second face;
   the first face of said semiconductor substrate supporting in turn the following superposed elements:
   a first array of conductive pads of substantially rectangular shape with a central opening, which are arranged in rows and columns, said pads being formed of material which forms a rectifying junction with the semiconductor substrate for serving as a floating grid;
   a layer of insulating material; and
   a conductive network capacitively coupled to the conductive pads for forming a control grid;
   the second face of said semiconductor substrate supporting in turn the following superposed elements:
   a second array of conductive pads serving as drains which are located opposite the central openings of the first array of conductive pads and and a plurality of ladder-shaped electrodes serving as sources which circumscribe the drains and are disposed in columns; and
   connections between the drains of a common row of all the columns of the array.

2. A large-format photosensitive device according to claim 1, wherein:
   a second layer of insulating material covers the second face of the semiconductor substrate—and supports the connections between the drains.

3. A large-format photosensitive device according to claim 2, wherein a layer of scintillator material covers the second insulating layer.

4. A large-format photosensitive device according to claim 1, wherein:
   a layer of scintillator material covers the second face of the semiconductor substrate and—the connections between the drains are carried by said layer of scintillator material.

5. A large-format photosensitive device according to claim 1, wherein each connection between the drains is connected to an output amplifier.

6. A large-format photosensitive device according to claim 1, wherein each source electrode is connected to a multiplexer which is in turn connected to a current source.

7. A large-format photosensitive device according to claim 5, wherein the output amplifiers are formed on the layer of insulating material that overlaps the first array of conductive pads.

8. A large-format photosensitive device according to claim 6, wherein the multiplexer is formed on the layer of insulating material that overlies the first array of conductive pads.

9. A method of utilization of a large-format photosensitive device according to claim 1, wherein zero-resetting of the device is performed by applying a positive pulse to the control grid and then restoring it to the ground potential of the device.

10. A method of utilization of a large-format photosensitive device according to claim 9, wherein reading of the device is performed by measuring the current at the output of output amplifiers while a multiplexer successively connects each source to a current source.

11. A method of utilization of a large-format photosensitive device according to claim 9, wherein zero-resetting of the device is performed by causing the positive pulse to be followed by a negative pulse whose amplitude grows gradually and then drops sharply.

12. A photosensitive device comprising
   a semiconductive substrate of amorphous hydrogenated silicon whose bulk is n-type doped to a first level,
   a conductive pattern on the first face of said substrate for forming a rectifying junction with said substrate and serving as a floating grid, said pattern including a plurality of picture frame-shaped pads arranged in rows and columns, each pad including an aperture for forming the apertures of the floating grid,
   an insulating layer overlying said first conductive pattern,
   a second conductive pattern overlying the insulating layer for forming a control grid in capacitive coupling with the floating grid by way of said insulating layer, a plurality of localized regions at the second face of the substrate that are doped n-type to a second level higher than said first level, said plurality including drain regions arranged in rows and columns and lying opposite apertures in the floating grid, and source regions arranged to form a row of ladders having rungs, each ladder enclosing between its rungs a column of drain regions.

13. A photosensitive device in accordance with claim 12 further characterized in that a second insulating layer overlies the plurality of localized regions and a conductive pattern overlies said second insulating layer and includes a plurality of conductors, each of which is connected to all the drains common to one row of the columns of the array.

14. A photosensitive device according to claim 13 in which said second insulating layer is a scintillator layer.

15. A photosensitive device according to claim 12 in which each picture frame-shaped pad on the first face of the substrate includes a rectangular-shaped aperture.

* * * * *